(12) United States Patent
Ryu et al.

(10) Patent No.: US 12,132,491 B2
(45) Date of Patent: Oct. 29, 2024

(54) SEMICONDUCTOR DEVICE AND OPERATING METHOD THEREOF

(71) Applicant: SAMSUNG ELECTRONICS CO., LTD., Suwon-si (KR)

(72) Inventors: Kyungho Ryu, Suwon-si (KR); Yongil Kwon, Suwon-si (KR); Kilhoon Lee, Suwon-si (KR); Jung-Pil Lim, Suwon-si (KR); Hyunwook Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 18/074,775

(22) Filed: Dec. 5, 2022

(65) Prior Publication Data

US 2023/0378963 A1 Nov. 23, 2023

(30) Foreign Application Priority Data

May 20, 2022 (KR) .................. 10-2022-0061880

(51) Int. Cl.
*H04L 7/00* (2006.01)
*G06F 1/10* (2006.01)
*G11C 7/22* (2006.01)
*H03L 7/091* (2006.01)
*H04L 7/033* (2006.01)

(52) U.S. Cl.
CPC ............... *H03L 7/091* (2013.01); *G06F 1/10* (2013.01); *G11C 7/222* (2013.01); *H04L 7/0037* (2013.01); *H04L 7/0087* (2013.01); *H04L 7/033* (2013.01)

(58) Field of Classification Search
CPC ........... H03L 7/091; G06F 1/10; G11C 7/222; H04L 7/0037; H04L 7/0087; H04L 7/033
USPC .................. 375/355, 354, 219, 295, 316
See application file for complete search history.

(56) References Cited

U.S. PATENT DOCUMENTS

| | | |
|---|---|---|
| 7,542,372 B2 | 6/2009 | Bae et al. |
| 7,852,706 B2 | 12/2010 | Bae et al. |
| 7,907,693 B2 | 3/2011 | Bae et al. |
| 8,619,848 B2 | 12/2013 | Jiang |
| 9,236,869 B2 | 1/2016 | Hata |
| 9,397,868 B1 | 7/2016 | Hossain et al. |
| 10,581,587 B1 | 3/2020 | Gupta et al. |
| 10,756,742 B1* | 8/2020 | Katsuragi ............ H03L 7/0807 |
| 10,848,350 B1 | 11/2020 | Hossain et al. |
| 11,258,577 B2 | 2/2022 | Zerbe |
| 2004/0264613 A1* | 12/2004 | Buchmann ............ H04L 7/0337 375/354 |
| 2010/0309791 A1* | 12/2010 | Fuller ................ H04L 25/0262 370/242 |

FOREIGN PATENT DOCUMENTS

JP 6360578 B1 7/2018

* cited by examiner

*Primary Examiner* — Zewdu A Kassa
(74) *Attorney, Agent, or Firm* — Sughrue Mion, PLLC

(57) ABSTRACT

The present disclosure provides methods and apparatuses for correcting skew. In some embodiments, a skew correcting device includes a plurality of samplers configured to sample first data based on a plurality of data clock signals with different phases, and a plurality of edge selectors configured to determine to switch at least one data clock signal of the plurality of data clock signals to an edge clock signal according to a sampling result of the plurality of samplers.

20 Claims, 12 Drawing Sheets

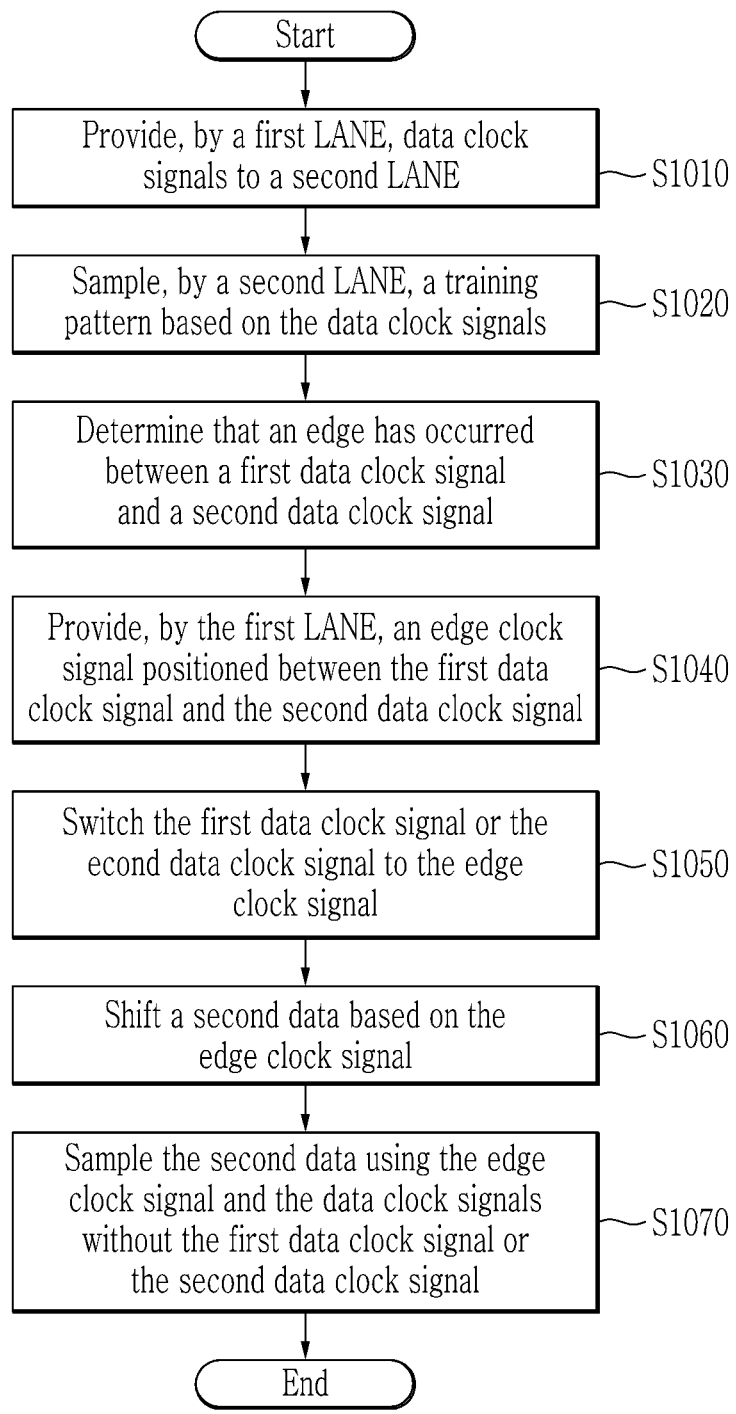

SEMICONDUCTOR DEVICE AND OPERATING METHOD THEREOF

CROSS-REFERENCE TO RELATED APPLICATIONS

This application claims benefit of priority under 35 U.S.C. § 119 to Korean Patent Application No. 10-2022-0061880, filed on May 20, 2022, in the Korean Intellectual Property Office, the disclosure of which is incorporated by reference herein in its entirety.

BACKGROUND

1. Field

The present disclosure relates semiconductor devices, and more particularly, to a semiconductor device comprising a skew correcting device and an operating method thereof.

2. Description of the Related Art

Recently, various types of electronic devices are in wide use. The electronic devices provide unique functions according to operations of electronic circuits included therein. The electronic devices may be individually operated or may be operated while communicating with other electronic devices. The electronic devices may include a transmitter and/or a receiver to communicate with other electronic devices.

A receiver of the electronic device may receive data from the transmitter of another electronic device. The receiver may use a clock and data recovery (CDR) circuit for recovering clock signals from the received data and recovering data based on the recovered clock signals. The CDR circuit may reduce complexity of communication channels between the transmitter and the receiver and may improve communication rates.

SUMMARY

According to an aspect of the present disclosure, a skew correcting device includes a plurality of samplers configured to sample first data based on a plurality of data clock signals with different phases, and a plurality of edge selectors configured to determine to switch at least one data clock signal of the plurality of data clock signals to an edge clock signal according to a sampling result of the plurality of samplers.

The skew correcting device may further include a controller configured to synchronize start timings of the plurality of data clock signals and the first data.

The plurality of samplers may be further configured to sequentially perform the sampling of the first data. The plurality of edge selectors may be further configured to, in response to an enable signal being at a third level, respectively output a selection signal, when a first level of a first output signal of a corresponding first sampler of the plurality of samplers differs from a second level of a second output signal of a second sampler of the plurality of samplers. The second sampler may be configured to perform the sampling of the first data after the corresponding first sampler performs the sampling of the first data.

The plurality of edge selectors may be further configured to, in response to the enable signal being at the third level, respectively output the selection signal, when the first level of the first output signal of the corresponding first sampler corresponds to a '0' and the second level of the second output signal of the second sampler corresponds to a '1'.

Each edge selector of the plurality of edge selectors may include a logic circuit and a latch. The logic circuit may be configured to output a logic output signal having a fourth level when the first level of the first output signal of the corresponding first sampler corresponds to a '0' and the second level of the second output signal of the second sampler corresponds to a '1'. The latch may be configured to store the logic output signal of the logic circuit, in response to the logic output signal having the fourth level and the enable signal being at the third level, and to output the selection signal based on the stored logic output signal.

The skew correcting device may further include a delay-locked loop (DLL) circuit configured to output, from a reference clock signal, a data clock signal and the edge clock signal.

The DLL circuit may be disposed on a second circuit configured to receive second data and to perform clock and data recovery (CDR). The plurality of samplers and the plurality of edge selectors may be disposed on a first circuit configured to perform CDR on the first data by using the data clock signal and the edge clock signal that are output by the DLL circuit.

The DLL circuit may be further configured to output the edge clock signal according to determination of the plurality of edge selectors.

The DLL circuit may include a buffer configured to delay an input clock signal resulting in a delayed clock signal, and a switch configured to output the input clock signal or the delayed clock signal, according to determination of the plurality of edge selectors.

The input clock signal may be the edge clock signal, and the delayed clock signal may be the data clock signal.

The switch may include at least one of a transmission gate and a tri-state inverter.

According to an aspect of the present disclosure, a skew correcting device includes a first circuit configured to receive first data and to perform CDR, and a second circuit configured to perform CDR on second data by using a data clock signal and an edge clock signal that are output by the first circuit. The second circuit includes an edge selector configured to select the edge clock signal that is near a rising edge of a redundancy bit of the second data. The first circuit comprises a DLL circuit configured to output the edge clock signal to the second circuit, according to a selection of the edge selector.

The edge selector may be further configured to receive a first output signal from a first sampler and a second output signal from a second sampler. The first sampler may be located in close proximity to the second sampler. The edge selector may be further configured to output a selection signal when a first level of the first output signal differs from a second level of the second output signal.

According to an aspect of the present disclosure, a method for correcting a skew of a second lane from a first lane of a multilane device is provided. The method includes providing, from the first lane to the second lane, a plurality of data clock signals for sampling a center of first data input to the first lane. The method further includes sampling, in the second lane, a training pattern based on the plurality of data clock signals. The method further includes determining, based on a sampling result in the second lane, that an edge is generated between a first data clock signal of the plurality of data clock signals and a second data clock signal of the plurality of data clock signals. The method further includes providing, from the first lane to the second lane, an edge clock signal disposed between the first data clock signal and the second data clock signal for sampling an edge of the first data. The method further includes switching at least one of the first data clock signal and the second data clock signal to the edge clock signal. The method further includes shifting second data input to the second lane based on the edge clock signal. The method further includes sampling the second data by using remaining data clock signals of the plurality of data clock signals excluding the first data clock signal or the second data clock signal, and the edge clock signal.

The training pattern may include at least one redundancy bit.

The method may further include sampling the at least one redundancy bit using the first data clock signal and the second data clock signal.

The edge generated between the first data clock signal and the second data clock signal may be a rising edge.

The switching of at least one of the first data clock signal and the second data clock signal to the edge clock signal may include switching the first data clock signal to the edge clock signal. The sampling of the second data may include sampling the second data by using the remaining data clock signals excluding the first data clock signal and the edge clock signal.

The switching of at least one of the first data clock signal and the second data clock signal to the edge clock signal may include switching the second data clock signal to the edge clock signal. The sampling of the second data may include sampling the second data by using the remaining data clock signals excluding the second data clock signal and the edge clock signal.

The determining that the edge is generated between the first data clock signal and the second data clock signal may include repeating the sampling of the training pattern for a quantity of k times, and determining two data clock signals having generated a greatest number of edges to be the first data clock signal and the second data clock signal. k may be an integer that is greater than 1.

BRIEF DESCRIPTION OF DRAWINGS

The above and other aspects, features, and advantages of certain embodiments of the present disclosure will be more apparent from the following description taken in conjunction with the accompanying drawings, in which:

FIG. 10 shows a flowchart of a skew correcting method, according to an embodiment;

DETAILED DESCRIPTION OF EMBODIMENTS

Figure 1:
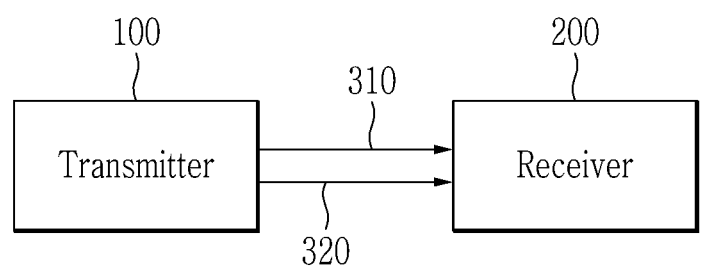
FIG. 1 shows a block diagram of an electronic system, according to an embodiment.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive, and like reference numerals designate like elements throughout the disclosure. In the flowcharts described with reference to the drawings in this disclosure, the operation order may be changed, various operations may be merged, certain operations may be divided, and certain operations may not be performed.

An expression recited in the singular may be construed as singular or plural unless the expression "one", "single", etc., is used. Terms including ordinal numbers such as first, second, and the like, will be used only to describe various components, and are not to be interpreted as limiting these components. The terms may be only used to differentiate one component from others.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. In embodiments, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

Figure 2:
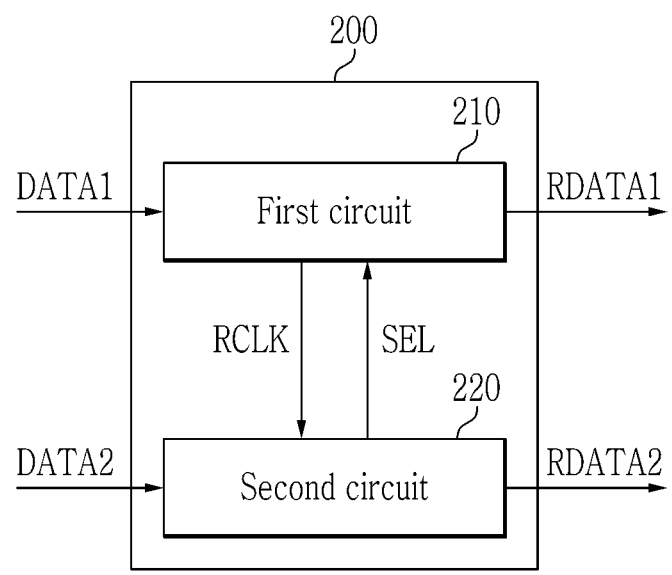
FIG. 2 shows a block diagram of a receiver, according to an embodiment.

FIG. 1 shows a block diagram of an electronic system according to an embodiment, and FIG. 2 shows a block diagram of a receiver shown in FIG. 1.

Referring to FIGS. 1 and 2, the electronic system 10 may include a transmitter 100 and a receiver 200. The transmitter 100 and the receiver 200 may be realized to be included in the different electronic devices or may be realized to be included in one electronic device.

In an embodiment, the transmitter 100 may be a host, and the receiver 200 may be a memory device. The host may include a central processing unit (CPU), a graphics processing unit (GPU), or an application processor (AP). The memory device may include a volatile memory device or a non-volatile memory.

In another embodiment, the transmitter 100 may be a host, and the receiver 200 may be a peripheral device. The peripheral device may include a display device, a communication device, and a storage device.

The transmitter 100 may transmit data DATA1 and DATA2 to the receiver 200 by using a first communication channel 310 and a second communication channel 320. For example, the transmitter 100 may transmit the first data DATA1 by using the first communication channel 310, and may transmit the second data DATA2 by using the second communication channel 320. The first data DATA1 may be different from the second data DATA2.

The first communication channel 310 and the second communication channel 320 may be respectively realized into a wired channel for a wired communication or a wireless channel for a wireless communication.

The receiver 200 may process the data DATA1 and DATA2 and may output recovered data RDATA1 and RDATA2. The receiver 200 may apply a clock and data recovery (CDR) operation to the data DATA1 and DATA2. For example, the receiver 200 may include a first circuit 210 for performing a CDR operation to the first data DATA1 and outputting the first recovered data RDATA1, and a second circuit 220 for performing a CDR operation to the second data DATA2 and outputting the second recovered data RDATA2. The receiver 200 may include an analog front end (AFE) (not shown) for amplifying the data DATA1 and DATA2 and converting the amplified data. The first circuit 210 and the second circuit 220 may perform a phase locking operation by using a training pattern before performing the CDR operation. The training pattern may include a redundancy bit on a same position as input data. In an embodiment, the redundancy bit may include bits '01', and without being limited thereto, the redundancy bit may include bit(s) such as '0', '1', '10', '001', '011', '100', '0011', '0001', '0111', or '1100'. The first circuit 210 and the second circuit 220 may respectively detect an edge of the redundancy bit through a sampling, and may pull the input data forward or push the same backward by the difference between the detected edge and an edge clock signal disposed near the detected edge to thus perform a phase locking.

The first circuit 210 may transmit the recovered clock signal RCLK to the second circuit 220. The recovered clock signal RCLK may include a data clock signal for sampling a center of the data DATA1 and DATA2 and an edge clock signal for sampling an edge of the data DATA1 and DATA2. The recovered clock signal RCLK may be used for the first circuit 210 to recover the first data DATA1. That is, the first circuit 210 may include a CDR circuit for generating the recovered clock signal RCLK. The CDR circuit may include a phase-locked loop (PLL) circuit and/or a delay-locked loop (DLL) circuit. The second circuit 220 may recover the second data DATA2 by using the recovered clock signal RCLK and may output the second recovered data RDATA2.

The first circuit 210 recovers the first data DATA1 through the CDR circuit, and the second circuit 220 recovers the second data DATA2 by using the recovered clock signal RCLK received from the first circuit 210, thereby correcting a skew between the first communication channel 310 and the second communication channel 320. The second circuit 220 uses the recovered clock signal RCLK received from the first circuit 210, and, as such, the second circuit 220 may recover the second data DATA2 without the need for an additional CDR circuit. As a result, the receiver 200 may be operated with low power, and the area needed by the receiver 200 may be reduced.

The second circuit 220 may transmit a selection signal SEL to the first circuit 210. The selection signal SEL may select the edge clock signal. For example, the second circuit 220 may receive a training pattern for correcting the skew with the first circuit 210. The second circuit 220 may detect the edge of the redundancy bit from the training pattern, and may transmit the selection signal SEL to the first circuit 210 to output the edge clock signal disposed near the corresponding edge. The redundancy bit may be different according to a protocol. For example, the protocol may be an intra-panel interface protocol, and may include an eRVDS (enhanced Reduced-Voltage Differential Signaling, enhanced RVDS), an EPI (Embedded Panel Interface), a CHPI (China BOE Point-to-Point Interface), a CSPI (China Star Point-to-Point Interface), an ISP (Integrated-Stream Protocol), or a CMPI (Clock Embedded Point-to-Point Interface). For example, the redundancy bit may be realized into 1 bit, 2 bits, 3 bits, or 4 bits. The second circuit 220 may perform a clock embedding operation by using the redundancy bit. The edge may be a rising edge or a falling edge. The first circuit 210 may transmit the edge clock signal selected according to the selection signal SEL to the second circuit 220. The second circuit 220 may perform a phase locking operation by using the edge clock signal. The second circuit 220 may correct the skew and output the second recovered data RDATA2 regardless of how much the skew of the first circuit 210 and the second circuit 220 is generated, such that the locking range of the second circuit 220 may not be limited.

The first circuit 210 may output the first recovered data RDATA1 to a first deserializer, and the second circuit 220 may output the second recovered data RDATA2 to a second deserializer.

FIG. 1 shows that two communication channels 310 and 320 are realized, and without being limited thereto, the communication channels 310 and 320 may be increased by the number of a multilane interface in an electronic system 10 using the multilane interface.

Figure 3:
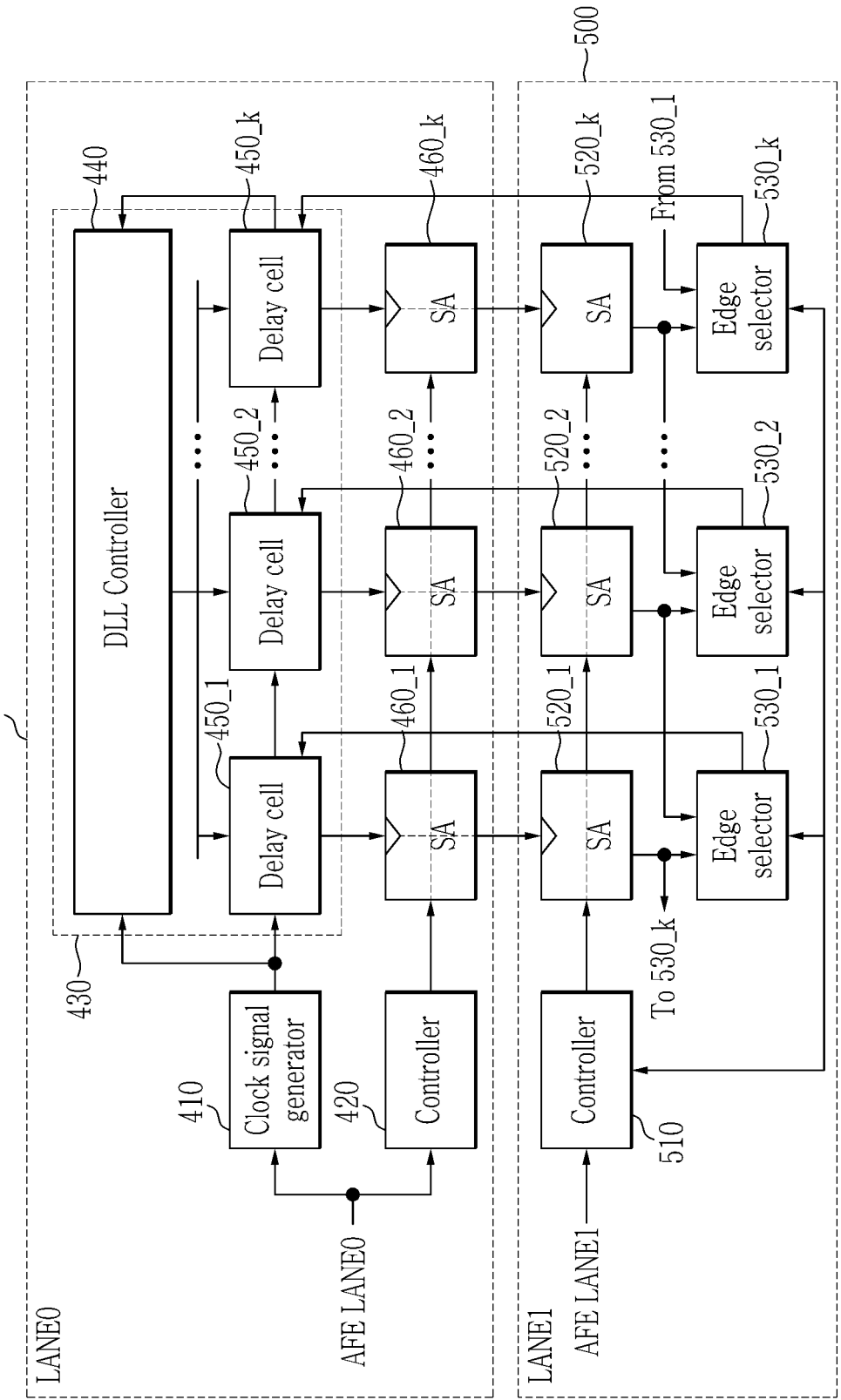
FIG. 3 shows a block diagram of a receiver, according to another embodiment.

FIG. 3 shows a block diagram of a receiver according to an embodiment.

Referring to FIG. 3, the receiver may include a first circuit 400 corresponding to a lane LANE0 and a second circuit 500 corresponding to a lane LANE1.

The first circuit 400 may include a clock signal generator 410, a controller 420, a phase-delayed loop (DLL) circuit 430, and a plurality of samplers 460_1 to 460_k (hereinafter "460" generally). Here, k may be an integer that is greater than 0. The k may correspond to a unit interval (UI) per one period of 1 T of the receiver. For example, k may be 9 when the receiver uses the protocol of 1 T=9 UI. In another example, k may be 8 when the receiver uses the protocol of 1 T=8 UI.

The clock signal generator 410 may receive the first data DATA1 and may output a reference clock signal to the DLL circuit 430. For example, the clock signal generator 410 may perform a clock recovery operation to the first data DATA1.

The controller 420 may receive the first data DATA1, and may output the first data DATA1 to the plurality of samplers 460 at a same timing as the reference clock signal. That is, the outputs of the clock signal generator 410 and the controller 420 may have the same timing.

The DLL circuit 430 may be operable as a CDR circuit. The DLL circuit 430 may include a DLL controller 440 and a plurality of delay cells 450_1 to 450_k (hereinafter "450" generally). The DLL controller 440 may control the delay cells 450 to output recovered clock signals with different phases. The recovered clock signals may have the phases with an integer multiple of 360/k degrees. The respective delay cells 450 may receive reference clock signals and may output the recovered clock signals with different phases to a plurality of samplers 460 of the first circuit 400 and a plurality of samplers 520_1 to 520_k (hereinafter "520" generally) of the second circuit 500. That is, the reference clock signals may sequentially pass through the delay cells 450 and may generate the recovered clock signals. The recovered clock signals may include a data clock signal and/or an edge clock signal. The data clock signal may be used to sample centers of data, and the edge clock signal may be used to sample edges of the data.

A structure of the delay cells 450 is described with reference to FIGS. 4 and 5.

The samplers 460 may sequentially perform sampling. The samplers 460 may sample the first data DATA1 by using the recovered clock signals received from the delay cells 450 and may output the first recovered data RDATA1. The samplers 460 may output the first recovered data RDATA1 to the first deserializer.

The second circuit 500 may include a controller 510, a plurality of samplers 520, and a plurality of edge selectors 530_1 to 530_k (hereinafter "530" generally).

The controller 510 may receive the second data DATA2, and may output the second data DATA2 to a plurality of samplers 520 at the same timing as the reference clock signal and the first data DATA1. That is, the outputs of the clock signal generator 410, the controller 420, and the controller 510 may have the same timing. For example, the controller 510 may include a phase detector for controlling the output timing of the second data DATA2. The phase detector may correct the skew between the lane LANE0 and the lane LANE1. A structure of the phase detector is described with reference to FIG. 7.

A plurality of samplers 520 may sequentially perform sampling. The samplers 520 may sample the second data DATA2 by using the recovered clock signals received from the delay cells 450 and may output the second recovered data RDATA2. The samplers 520 may output the second recovered data to the edge selectors 530. For example, the sampler 520_1 may transmit outputs to the edge selector 530_1 and the edge selector 530_k, the sampler 520_2 may transmit outputs to the edge selector 530_2 and the edge selector 530_1, and the sampler 520_k may transmit outputs to the edge selector 530_k and the edge selector 530_2. The samplers 520 may output the second recovered data to the second deserializer.

First, a plurality of samplers 520 may receive data clock signals of the recovered clock signals from a plurality of delay cells 450 to sample the second data DATA2, and may output sampling results to a plurality of edge selectors 530.

The edge selectors 530 may detect data clock signals that are near the timing at which a rising edge or a falling edge is generated based on the sampling results of the second data DATA2 output from the samplers 520. It is assumed hereinafter that two adjacent data clock signals generated with respect to the rising edge or the falling edge are a first data clock signal and a second data clock signal. That, the rising edge or the falling edge may be positioned between the first data clock signal and the second data clock signal. For example, the first data clock signal may be output from the delay cell 450_1, and the second data clock signal may be output from the delay cell 450_2. When a sampling result value of the second data DATA2 sampled by the sampler 520_1 by the first data clock signal is different from a sampling result value of the second data DATA2 sampled by the sampler 520_2 by the second data clock signal, the edge selector 530_1 may determine that an edge is generated between the first data clock signal and the second data clock signal. The edge selector 530_1 may determine that the rising edge is generated when the sampling result value of the second data DATA2 sampled by the first data clock signal is '0', and the sampling result value of the second data DATA2 sampled by the second data clock signal is '1'. The edge selector 530_1 may determine that the falling edge is generated when the sampling result value of the second data DATA2 sampled by the first data clock signal is '1', and the sampling result value of the second data DATA2 sampled by the second data clock signal is '0'. In this instance, the samplers 520 may respectively repeat the sampling operation for m times according to a plurality of data clock signals, and the edge selectors 530 may respectively determine two data clock signals having generated the greatest number of the edges to be the first data clock signal and the second data clock signal. The number m may be an integer that is greater than 1.

From among a plurality of edge selectors 530, the edge selector for receiving the output signal synchronized with the first data clock signal and generated by sampling the second data DATA2 and the output signal synchronized with the second data clock signal and generated by sampling the second data DATA2 may output a selection signal SEL for controlling to output not the data clock signal but the edge clock signal to one of the two delay cells for outputting the first data clock signal and the second data clock signal from among a plurality of delay cells 450.

For example, the edge selector 530_1 may respond to a control signal of the controller 510 and may output the selection signal SEL to the delay cell 450_1 so that the delay cell 450_1 may output not the first data clock signal but the first edge clock signal.

For another example, the edge selector 530_2 may respond to a control signal of the controller 510 and may output the selection signal SEL to the delay cell 450_2 so that the delay cell 450_2 may output not the second data clock signal but the second edge clock signal. That is, one of the delay cells 450 may output the data clock signal or the edge clock signal according to one corresponding selection signal SEL from among a plurality of edge selectors 530.

The edge selectors 530 may output the selection signal SEL to the controller 510. The controller 510 may include a phase detector and an accumulator. Regarding the controller 510, the phase detector may output a down (DN) signal or an up (UP) signal to the accumulator according to a plurality of sampling result values received from a plurality of samplers 520 and a plurality of selection signals SEL received from a plurality of edge selectors 530. The accumulator may pull forward the output timing of the second data DATA2 according to the down (DN) signal. The accumulator may delay the output timing of the second data DATA2 according to the up (UP) signal. A structure of a plurality of edge selectors 530 is described with reference to FIG. 6.

FIG. 3 shows the DLL circuit 430 as the CDR circuit, and without being limited thereto, the CDR circuit may be realized with a PLL circuit.

Figure 4:
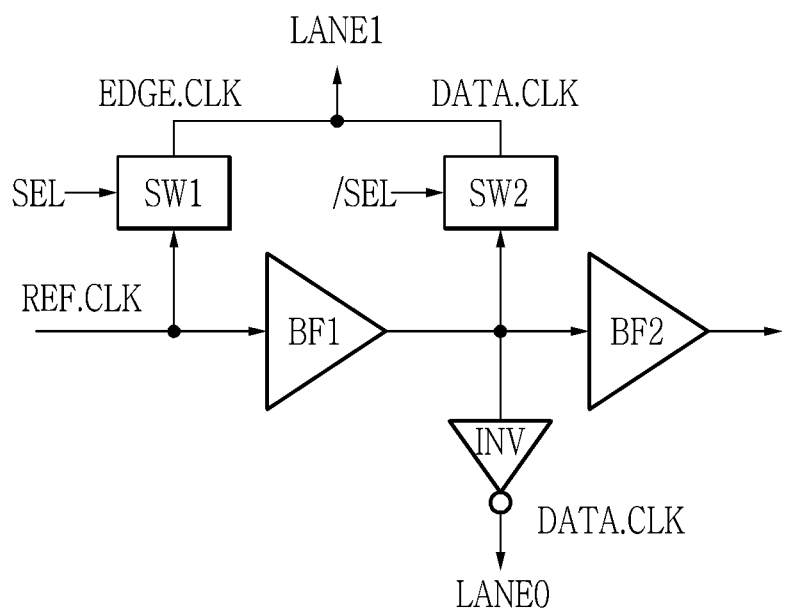
FIG. 4 shows a circuit diagram of a delay cell, according to an embodiment.

FIG. 4 shows a circuit diagram of a delay cell according to an embodiment.

Referring to FIG. 4, each delay cell of the plurality of delay cells 450, according to an embodiment, may include a switch SW1, a switch SW2, a buffer BF1, a buffer BF2, and an inverter INV.

The switch SW1 is switched according to the selection signal SEL, and when the switch SW1 is turned on by the selection signal SEL, the reference clock signal REF.CLK may be output as an edge clock signal EDGE.CLK. The reference clock signal REF.CLK may pass through the buffer BF1 and may be input to the switch SW2 and the inverter INV. The switch SW2 is switched according to an inverted selection signal /SEL, and when the switch SW2 is turned on by the inverted selection signal /SEL, an output signal of the buffer BF1 may be output as a data clock signal DATA.CLK. The inverted selection signal /SEL may be an inverted signal of the selection signal SEL. The switch SW1 and the switch SW2 may invert input signals and may output resultant signals.

An output terminal of the switch SW1 is connected to an output terminal of the switch SW2 so the switch SW1 and the switch SW2 may be operated as a multiplexer (MUX). For example, the switch SW1 and the switch SW2 may be realized with a transmission gate or a tri-state inverter. The switch SW1 and the switch SW2 may output the edge clock signal EDGE.CLK or data clock signal DATA.CLK to the sampler of the lane LANE1 according to the selection signal SEL and the inverted selection signal /SEL.

The inverter INV may output the data clock signal DATA.CLK that is an inverted output signal of the buffer BF1 to the sampler of the lane LANE0.

The reference signal REF.CLK may sequentially pass through the buffer BF1 and the buffer BF2 and may be input to the next delay cell.

FIG. 4 shows that the switch SW1 outputs the edge clock signal EDGE.CLK, and the switch SW2 outputs the data clock signal DATA.CLK, and without being limited thereto, the switch SW1 may be realized to output the data clock signal DATA.CLK, and the switch SW2 may be realized to output the edge clock signal EDGE.CLK.

Figure 5:
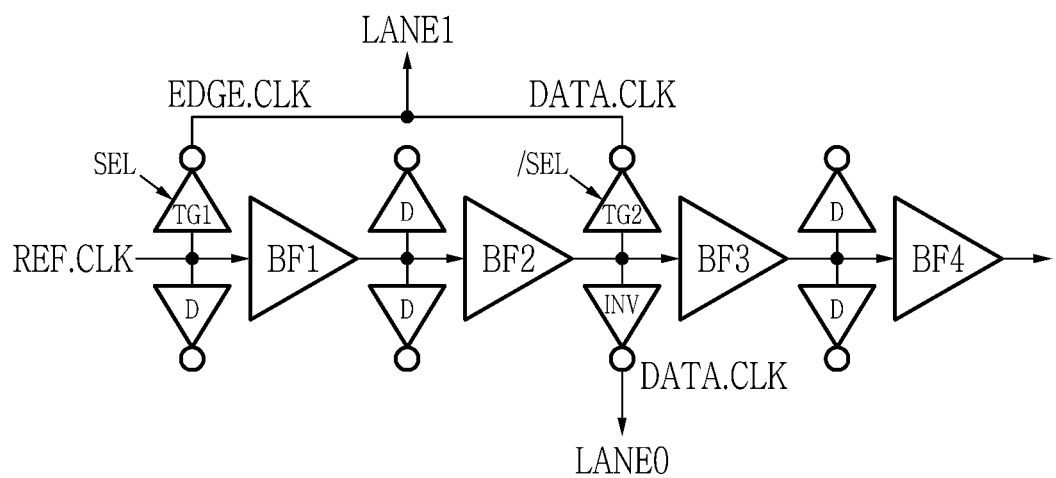
FIG. 5 shows a circuit diagram of a delay cell, according to another embodiment.

FIG. 5 shows a circuit diagram of a delay cell according to another embodiment.

Referring to FIG. 5, each delay cell of the plurality of delay cells 450, according to another embodiment, may include a transmission gate TG1, a transmission gate TG2, a buffer BF1, a buffer BF2, a buffer BF3, a buffer BF4, an inverter INV, and a plurality of dummy cells D.

The transmission gate TG1 may output the reference clock signal REF.CLK as the edge clock signal EDGE.CLK based on the selection signal SEL. The reference clock signal REF.CLK may pass through the buffer BF1 and the buffer BF2 and may be input to the transmission gate TG2 and the inverter INV. The transmission gate TG2 may output the output signal of the buffer BF2 as the data clock signal DATA.CLK based on the inverted selection signal /SEL.

An output terminal of the transmission gate TG1 is connected to an output terminal of the transmission gate TG2 so the transmission gate TG1 and the transmission gate TG2 may be operated as the multiplexer MUX. The transmission gate TG1 and the transmission gate TG2 may output the edge clock signal EDGE.CLK or the data clock signal DATA.CLK to the sampler of the lane LANE1 according to the selection signal SEL and the inverted selection signal /SEL.

The inverter INV may output the data clock signal DATA.CLK that is the inverted output signal of the buffer BF2 to the sampler of the lane LANE0.

A plurality of dummy cells D may have a same structure as the transmission gates TG1 and TG2. Input terminals of the dummy cells D receiving the reference clock signal REF.CLK may be connected to the transmission gate TG1. The input terminals of the two dummy cells D disposed between the buffer BF1 and the buffer BF2 may be connected to the buffer BF2. The input terminals of the two dummy cells D and the buffer BF2 may be connected to the output terminal of the buffer BF1. The input terminals of the two dummy cells D disposed between the buffer BF3 and the buffer BF4 may be connected to the buffer BF4. The input terminals of the two dummy cells D and the buffer BF4 may be connected to an output terminal of the buffer BF3. Output terminals of a plurality of dummy cells D may be opened. The dummy cells D may be disposed to improve delay characteristics of the buffers BF1 to BF4.

The reference signal REF.CLK may sequentially pass through the buffer BF1, the buffer BF2, the buffer BF3, and the buffer BF4 and may be input to the next delay cell.

FIG. 5 shows that the transmission gate TG1 outputs the edge clock signal EDGE.CLK and the transmission gate TG2 outputs the data clock signal DATA.CLK, and without being limited thereto, the transmission gate TG1 may be realized to output the data clock signal DATA.CLK and the transmission gate TG2 may be realized to output the edge clock signal EDGE.CLK. The number of the buffers BF1 to BF4 may be increased to even numbers or may be reduced, and the number of the dummy cells D may be realized in different ways.

Figure 6:
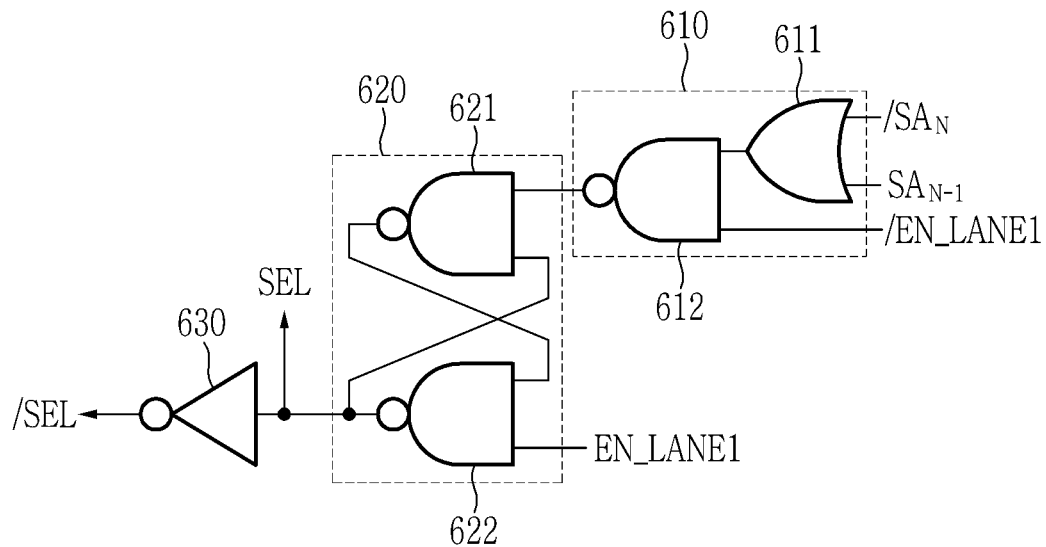
FIG. 6 shows a circuit diagram of an edge selector, according to an embodiment.

FIG. 6 shows a circuit diagram of an edge selector according to an embodiment.

Referring to FIG. 6, each edge selector of a plurality of edge selectors 530, according to an embodiment, may respond to the enable signal EN_LANE1 and may output the selection signal SEL when an output signal $SA_{N-1}$ of the corresponding first sampler from among a plurality of samplers 520 and an output signal $SA_N$ of the second sampler for performing sampling after the first sampler from among a plurality of samplers 520 have different levels. For example, the edge selectors 530 may output the selection signal SEL in response to the enable signal EN_LANE1 when the output signal $SA_{N-1}$ of the first sampler is '0' and the output signal $SA_N$ of the second sampler is '1' (e.g., /$SA_N$ is '0').

The respective edge selectors 530 may include an OR-AND-INVERT (OAI) circuit 610, a latch circuit 620, and an inverter 630.

In detail, the OAI circuit 610 may detect the sampler 520 that has the sampling results of '0' and '1' from among a plurality of samplers 520. The OAI circuit 610 may include an OR gate 611 and a NAND gate 612.

The OR gate 611 may receive the outputs of the two adjacent samplers from among a plurality of samplers 520, and may perform an OR operation based on the output signal. For example, the OR gate 611 may perform an OR operation to an inverted signal /SA$_N$ that is an inverted output of the N-th sampler and the output signal SA$_{N-1}$ of the (N−1)-th sampler that is near (e.g., in close proximity to) the N-th sampler, and may output a first logic signal.

The NAND gate 612 may perform a NAND operation to the first logic signal and the inverted enable signal /EN_LANE1 and may output a second logic signal. The latch circuit 620 may store an output value of the OAI circuit 610. The latch circuit 620 may include two NAND gates 621 and 622. The latch circuit 620 may be realized with an SR latch.

The NAND gate 621 may perform a NAND operation to the second logic signal and the third logic signal and may output a fourth logic signal to the NAND gate 622. The third logic signal may be an output signal of the NAND gate 622. The NAND gate 622 may perform a NAND operation to the fourth logic signal and the enable signal EN_LANE1 and may output the third logic signal to the NAND gate 621. The inverted enable signal /EN_LANE1 and the enable signal EN_LANE1 are transmitted to a plurality of edge selectors 530 by the controller 510.

The third logic signal may be respectively input as the selection signal SEL to the phase detector of the controller 510 and a plurality of delay cells 450.

The inverter 630 may invert the third logic signal and may output the inverted selection signal /SEL to the phase detector of the controller 510 and a plurality of delay cells 450.

When the inverted enable signal /EN_LANE1 input to the NAND gate 612 is '1', and the inverted signal /SA$_N$ and the output signal SA$_{N-1}$ are '0', the NAND gate 612 may output '1'. When at least one of the inverted signal /SA$_N$ and the output signal SA$_{N-1}$ is '1', the two inputs of the NAND gate 612 are '1's so the NAND gate 612 may output '0'. When the inverted enable signal /EN_LANE1 is '1', the output of the OR gate 611 is '1' except in the case that the outputs of the two samplers are '0' and '1', so the NAND gate 612 outputs '0'.

When the inverted enable signal /EN_LANE1 is '0' (e.g., the enable signal EN_LANE1 is '1'), the output of the NAND gate 622 is '0' when the output of the NAND gate 621 is '1', and the output of the NAND gate 622 is '1' when the output of the NAND gate 621 is '0'. When the output of the NAND gate 612 becomes '1', all the inputs of the NAND gate 621 become '1' and the output of the NAND gate 621 becomes '0', all the inputs of the NAND gate 622 becomes '0' and the output of the NAND gate 622 becomes '1', and the selection signal SEL having a level of turning on the switch SW1 may be generated. The transmission gate TG1 is turned on by the selection signal SEL, and the reference clock signal REF.CLK may be output as the edge clock signal EDGE.CLK.

Figure 7:
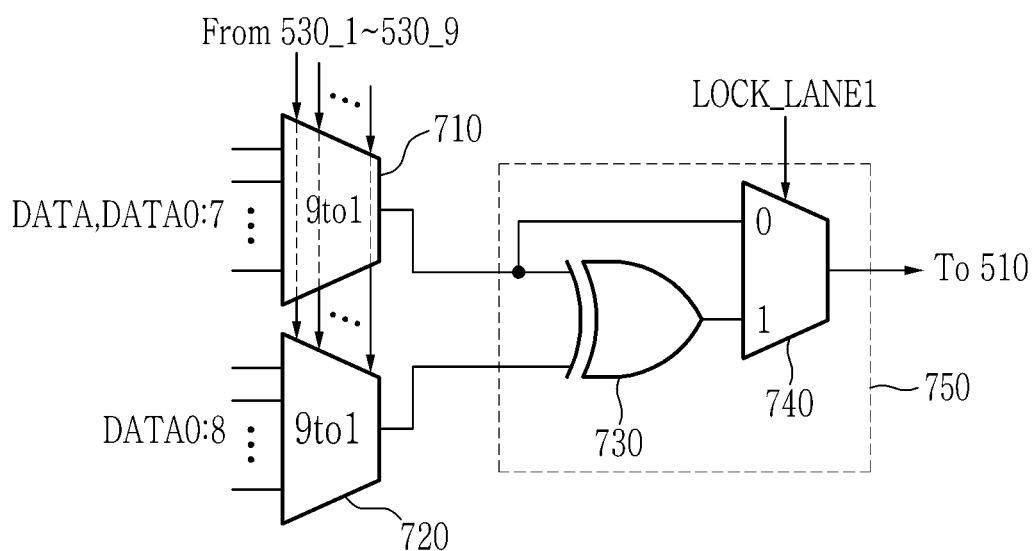
FIG. 7 shows a circuit diagram of a phase detector, according to an embodiment.

FIG. 7 shows a circuit diagram of a phase detector according to an embodiment.

Referring to FIG. 7, the phase detector may include a multiplexer 710, a multiplexer 720, and an up/down signal generator 750. The up/down signal generator 750 may include an exclusive OR gate (XOR gate) 730 and a multiplexer 740.

The XOR gate 730 may perform an XOR operation to the output of the multiplexer 710 and the output of the multiplexer 720, and may output the XOR operation result to a terminal 1 of the multiplexer 740. The output of the multiplexer 710 may also be input to a terminal 0 of the multiplexer 740. The multiplexer 740 may use a locking signal LOCK_LANE1 received from a control logic of the controller 510 to output an output of the multiplexer 710, or output an XOR operation result of the XOR gate 730.

For example, when the second circuit 200 is not locked, the control logic of the controller 510 may output the value of '0' as a locking signal LOCK_LANE1, and when the second circuit 200 is locked, the control logic of the controller 510 may output the value of '1' as the locking signal LOCK_LANE1.

The value of '0' output by the multiplexer 740 may signify the down (DN) signal, and the value of '1' may signify the up (UP) signal. The multiplexer 740 may transmit the down (DN) signal or the up (UP) signal to the accumulator in the controller 510. The accumulator may pull forward the output timing of the second data DATA according to the down (DN) signal. The accumulator may push the output timing of the second data DATA backward according to the up (UP) signal.

The multiplexer 710 may use nine selection signals SEL output by the edge selectors 530_1 to 530_9, may select one of the nine values sampled by the nine samplers, and may output the selected value. When the second circuit 500 is not locked, the data DATA8 and DATA0:7 may be values generated when the nine samplers sample the input data delayed by 1 UI by using nine data clock signals with different phases received from the first circuit 400. When the second circuit 500 is locked, the data DATA8 and DATA0:7 may be values generated when the nine samplers sample the input data delayed by 1 UI by using eight data clock signals with different phases received from the first circuit 400, and one edge clock signal. For example, when there is an edge of the input data between the third data clock signal and the fourth data clock signal from among the nine data clock signals (first to ninth data clock signals), the data DATA8 and DATA0:7 may be values obtained by sampling the input data delayed by 1 UI by using the first, second, and fourth to ninth data clock signals, and the third edge clock signal.

The multiplexer 720 may select one of the nine values sampled by the nine samplers by using the nine selection signals SEL output by the edge selectors 530_1 to 530_9, and may output the selected value. The data DATA0:8 may be values obtained when the nine samplers sample the input data by using the nine data clock signals with different phases received from the first circuit 400. The data DATA8 and DATA0:7 input to the multiplexer 710 may be slower than the data DATA0:8 input to the multiplexer 720 by 1 UI. The multiplexer 710 and the multiplexer 720 may be realized with a 9 to 1 multiplexer.

The XOR gate 730 may perform an XOR operation to the output value of the multiplexer 710 and the output value of the multiplexer 720 and may output a logic value. The XOR gate 730 may output the logic value to the multiplexer 740. When the locking signal LOCK_LANE1 is '1', the multiplexer 740 may output the logic value of the XOR gate 730. The multiplexer 740 may be realized with a 2 to 1 multiplexer.

FIG. 7 shows that the receiver uses the protocol of 1 T=9 UI, k=9, the number of the edge selectors 530 is 9, and the multiplexers 710 and 720 are realized with the 9 to 1 multiplexer, and without being limited thereto, other units of the protocol may be performed by changing the number of the edge selectors 530 and the type of the multiplexers 710 and 720.

Figure 8A:
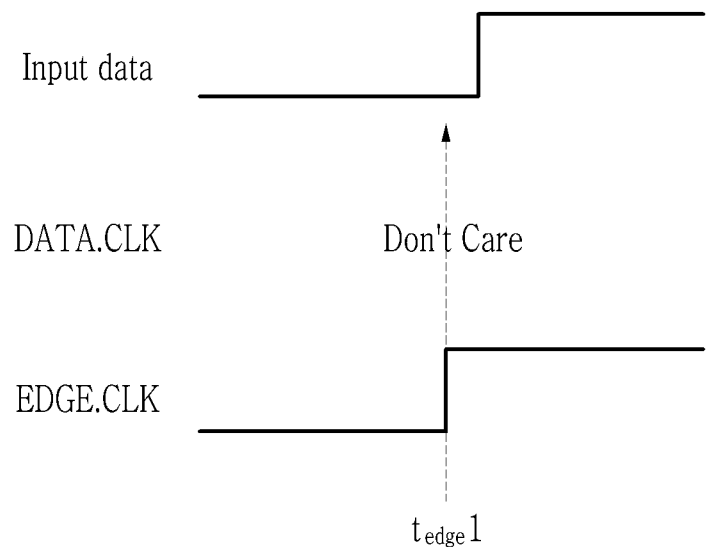
FIGS. 8A and 8B show timing diagrams on an operation of an up/down signal generator, according to an embodiment.
Figure 8B:
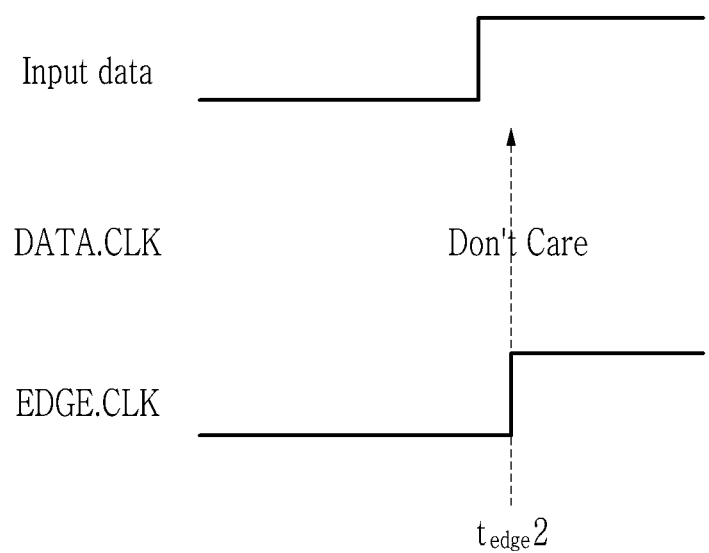
Figure 9A:
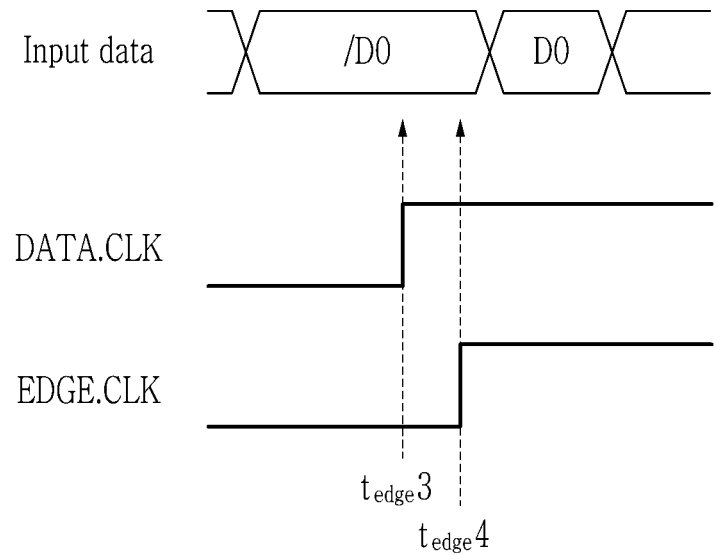
FIGS. 9A and 9B show timing diagrams on an operation of an up/down signal generator, according to another embodiment.
Figure 9B:
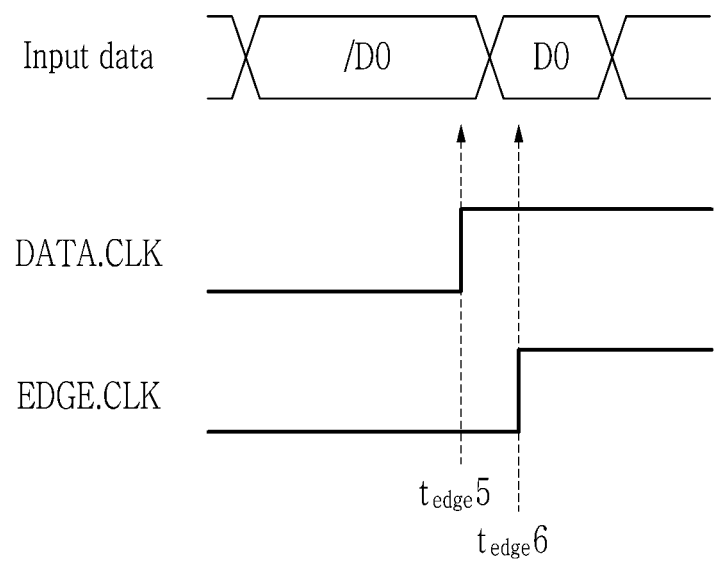

FIGS. 8A and 8B show timing diagrams on an operation of an up/down signal generator according to an embodiment, and FIGS. 9A and 9B show timing diagrams of an operation of an up/down signal generator according to another embodiment.

Hereinafter, the operation of the up/down signal generator 750 is described assuming that the up/down signal generator 750 receives the value obtained by sampling the input data by the sampler by using the edge clock signal EDGE.CLK and the value obtained by sampling the same by using a plurality of data clock signals DATA.CLK.

FIGS. 8A and 8B show a timing diagram on an operation of the up/down signal generator when the second circuit 500 is not locked and the control logic of the controller 510 outputs the value of '0' as the locking signal LOCK_LANE1 to the multiplexer 740.

As shown in FIGS. 8A and 8B, as the value of '0' as the locking signal LOCK_LANE1 is input to the multiplexer 740, the multiplexer 740 may output the value obtained by sampling the input data by using the edge clock signal EDGE.CLK.

Referring to FIG. 8A, the sampler may sample the input data at the time ($t_{edge}1$) when the rising edge is generated by using the edge clock signal EDGE.CLK. The sampler may output the sampling result value of '0' to the up/down signal generator 750. That is, FIG. 8A may represent the case when the edge clock signal EDGE.CLK is faster than the edge of the input data. The up/down signal generator 750 may output the down (DN) signal to the accumulator of the controller 510 by outputting the value of '0'. The accumulator may pull forward the output timing of the input data according to the down (DN) signal.

Referring to FIG. 8B, the sampler may sample the input data at the time ($t_{edge}2$) when the rising edge is generated by using the edge clock signal EDGE.CLK. The sampler may output the sampling result value of '1' to the up/down signal generator 750. That is, FIG. 8B may show the case when the edge clock signal EDGE.CLK is slower than the edge of the input data. The up/down signal generator 750 may output the up (UP) signal to the accumulator of the controller 510 by outputting the value of '1'. The accumulator may push the output timing of the input data backward according to the down (DN) signal.

FIGS. 9A and 9B show a timing diagram on an operation of the up/down signal generator when the second circuit 500 is locked and the control logic of the controller 510 outputs the value of '1' as the locking signal LOCK_LANE1 to the multiplexer 740.

Referring to FIGS. 9A and 9B, as the value of '1' as the locking signal LOCK_LANE1 is input to the multiplexer 740, the multiplexer 740 may output the XOR operation result of the XOR gate 730.

FIG. 9A may represent the case when the edge clock signal EDGE.CLK is faster than the edge of the input data. The first sampler may use the data clock signal DATA.CLK and may sample the input data at the time ($t_{edge}3$) when the rising edge is generated, and the second sampler may use the edge clock signal EDGE.CLK and may do the same to the input data at the time ($t_{edge}4$) when the rising edge is generated. The first sampler may be disposed near (e.g., in close proximity to) the second sampler.

The sampling result value of the first sampler is equal to the sampling result value of the second sampler so the output of the multiplexer 710 may be equal to the output of the multiplexer 720. The XOR gate 730 of the up/down signal generator 750 may output '0', and the multiplexer 740 may output '0'. The up/down signal generator 750 may output the down (DN) signal to the accumulator of the controller 510 by outputting the value of '0'. The accumulator may pull forward the output timing of the input data according to the down (DN) signal.

FIG. 9B may represent the case when the edge clock signal EDGE.CLK is slower than the edge of the input data. The first sampler may sample the input data at the time ($t_{edge}5$) when the rising edge is generated by using the data clock signal DATA.CLK, and the second sampler may sample the input data at the time ($t_{edge}6$) when the rising edge is generated by using the edge clock signal EDGE.CLK. The first sampler may be disposed near (e.g., in close proximity to) the second sampler.

As the sampling result value of the first sampler is different from the sampling result value of the second sampler, the output of the multiplexer 710 may be different from the output of the multiplexer 720. The XOR gate 730 of the up/down signal generator 750 may output '1', and the multiplexer 740 may output '1'. The up/down signal generator 750 may output the up (UP) signal to the accumulator of the controller 510 by outputting the value of '1'. The accumulator may delay the output timing of the input data according to the up (UP) signal. That is, the skew of the input data and the edge clock signal EDGE.CLK may be corrected according to the operation of the controller 510.

FIG. 10 shows a flowchart of a skew correcting method according to an embodiment.

Referring to FIG. 10, the receiver according to an embodiment may include a first circuit and a second circuit and may perform a skew correcting method. The first circuit may correspond to the first lane LANE0, and may receive first data and may output first recovered data. The second circuit may correspond to the second lane LANE1 and may receive second data and may output second recovered data. The receiver may perform a CDR operation to the first circuit to lock the first lane LANE0, and may perform a skew correcting method to the second circuit.

The first circuit may provide a plurality of data clock signals for sampling the center of the first data input to the first circuit to the second circuit (S1010). The first circuit may include a plurality of delay cells for outputting a plurality of data clock signals. The delay cells may include a buffer for receiving the reference clock signals and outputting data clock signals. The buffer may receive the reference clock signals and may output edge clock signals.

The second circuit may sample a training pattern based on the data clock signals (S1020). The training pattern may correspond to the second data that are input to correct the skew between the first circuit and the second circuit. The first circuit may, when performing a CDR operation, receive a training pattern corresponding to first data and may perform a locking operation. The second circuit may sample the training pattern to find the sampler in which an edge is generated. For example, the second circuit may find that an edge is generated between the sampling result of the third sampler and the sampling result of the fourth sampler from among a plurality of samplers.

The second circuit may determine that an edge is generated between a first data clock signal and a second data clock signal from among a plurality of data clock signals based on the sampling result (S1030). The first data clock signal may be input to the third sampler, and the second data clock signal may be input to the fourth sampler. The value of '0' may be output as the sampling result of the third sampler, and the value of '1' may be output as the sampling result of the fourth sampler.

The first circuit may provide the edge clock signal positioned between a first data clock signal and a second data clock signal from among a plurality of edge clock signals for sampling an edge of the first data to the second circuit (S1040). A plurality of delay cells of the first circuit may be further configured to output the edge clock signal. That is, the respective delay cells may further include a switch for outputting the edge clock signal or the data clock signal. The switch may be realized with a transmission gate or a tri-state inverter.

The first circuit may switch the first data clock signal or the second data clock signal to the edge clock signal (S1050). For example, the second circuit may output the selection signal SEL for instructing to output not the first data clock signal or the second data clock signal but the first edge clock signal to the first circuit. The second circuit may include an edge selector for outputting the selection signal SEL.

For example, the second circuit may output the selection signal SEL to a third delay cell connected the third sampler in the first circuit. The third delay cell may output not the first data clock signal but the first edge clock signal according to the selection signal SEL.

For another example, the second circuit may output the selection signal SEL to a fourth delay cell connected to the fourth sampler in the first circuit. The fourth delay cell may output not the second data clock signal but the first edge clock signal according to the selection signal SEL.

The second circuit may shift the second data input to the second circuit based on the edge clock signal (S1060). For example, the second circuit may include a controller for shifting the second data. The controller of the second circuit may pull the timing of the second data forward or push the same backward according to the UP signal or DN signal according to the selection signal SEL from the edge selector. The controller of the second circuit may include a phase detector for outputting the UP signal or the DN signal according to the selection signal SEL from the edge selector.

The second data may be sampled by using the data clock signal and the edge clock signal excluding the first data clock signal or the second data clock signal from among a plurality of data clock signals (S1070).

For example, the second circuit may sample the second data by using the clock signals and the first edge clock signal excluding the first data clock signal from among a plurality of data clock signals.

For another example, the second circuit may sample the second data by using the clock signals and the first edge clock signal excluding the second data clock signal from among a plurality of data clock signals.

The second circuit may sample the second data and may output second recovered data to the deserializer.

Figure 11:
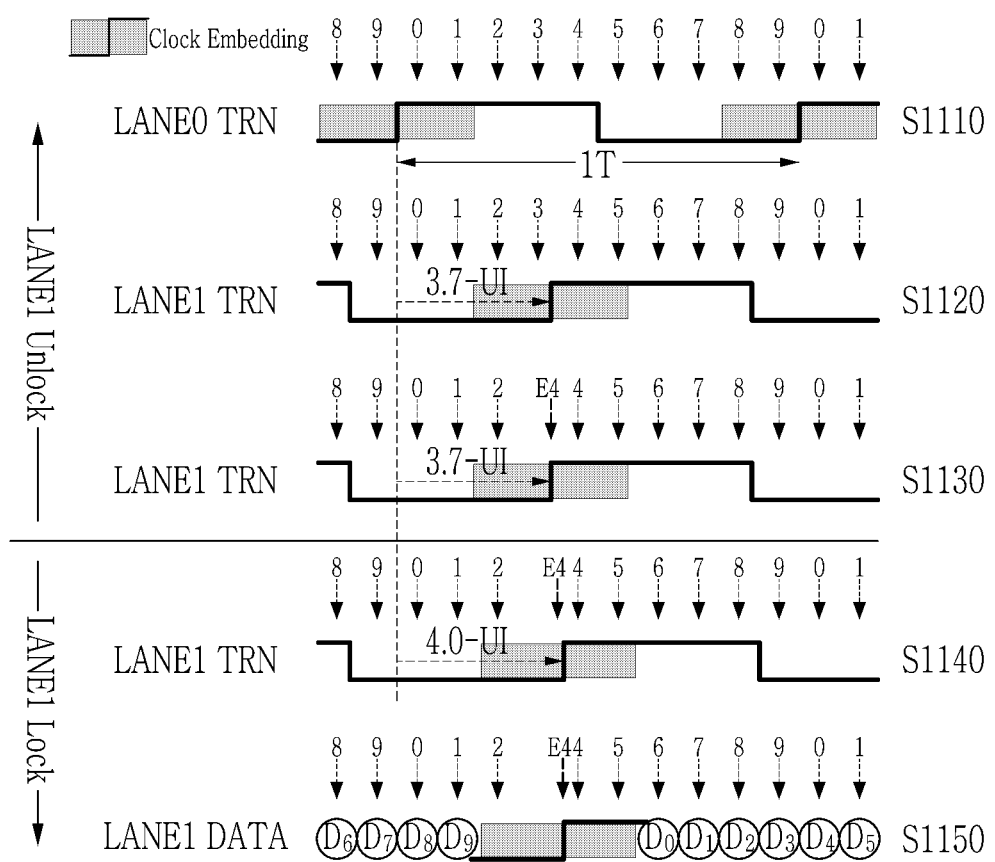
FIG. 11 shows a skew correcting method, according to an embodiment.
Figure 12:
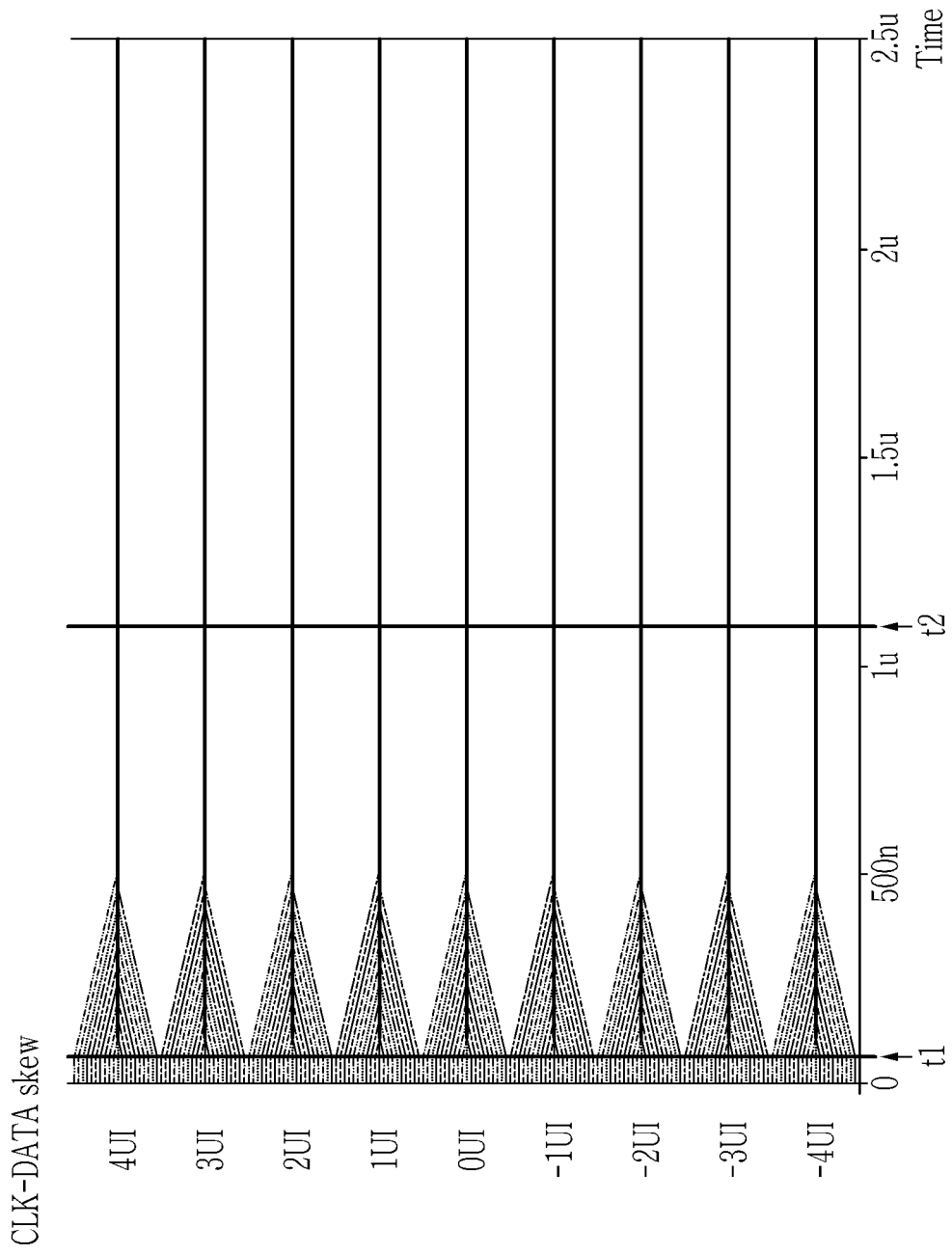
FIG. 12 shows a graph of simulation results obtained by performing a skew correcting method, according to an embodiment.

FIG. 11 shows a skew correcting method according to an embodiment, and FIG. 12 shows a graph of simulation results obtained by performing a skew correcting method according to an embodiment.

Referring to FIG. 11, the receiver according to an embodiment may use the protocol of 1 T=10 UI, and may use redundancy bits of 4 bits for clock embedding just before a time when the data start on the time axis.

The first circuit may perform a locking operation to the lane LANE0 by using a training pattern LANE0 TRN on the lane LANE0 and the data clock signal (S1110). Referring to FIG. 11, arrows marked with numbers of 0 to 9 and facing downward may indicate respective edges of ten data clock signals.

The first circuit may transmit the data clock signals used for the locking operation of the lane LANE0 to the second circuit (S1120). The second circuit may receive the training pattern LANE1 TRN on the lane LANE1. The skew by 3.7 UI may exist between the training pattern LANE0 TRN for the lane LANE0 and the training pattern LANE1 TRN for the lane LANE1. The second circuit may sample the training pattern LANE1 TRN for the lane LANE1 by using ten data clock signals. It is found from the sampling result that the rising edge is generated between the data clock signal of the number 3 and the data clock signal of the number 4 in the second circuit. That is, the value of '0' may be output as the sampling result of the data clock signal of the number 3, and the value of '1' may be output as the sampling result of the data clock signal of the number 4.

The second circuit may output the selection signal SEL for instructing the delay cell outputting the data clock signal of the number 3 from among a plurality of delay cells of the first circuit to output the edge clock signal E4 of the number 4 (S1130). The second circuit may include the edge selector for outputting the selection signal SEL. The remaining delay cells from among a plurality of delay cells may output the data clock signals. The locking operation of the lane LANE1 may be completed.

The second circuit may delay the timing of the training pattern LANE1 TRN for the lane LANE1 so that an edge generated time of the training pattern LANE1 TRN may be identical to an edge generated time of the edge clock signal E4 of the number 4 (S1140). That is, the second circuit may further include a phase detector for controlling the timing. Hence, the skew by 3.7 UI may be corrected to 4.0 UI between the training pattern LANE0 TRN for the lane LANE0 and the training pattern LANE1 TRN for the lane LANE1. The skew may be removed from the deserializer or the link to thus allow alignment of data.

The second circuit may sample the data LANE1 DATA and may generate recovered data based on a timing-controlled training pattern (S1150).

Referring to FIG. 12, when there is a skew (e.g., CLK-DATA skew) between the edge clock signal output by the lane LANE0 and the input data for the lane LANE1, it may be found that how the skew value changes with respect to time (Time). The CLK-DATA skew between the edge clock signal output by the lane LANE0 and the input data for the lane LANE1 may be identical to the skew between the training pattern LANE0 TRN for the lane LANE0 and the training pattern LANE1 TRN for the lane LANE1.

FIG. 12 shows output results of the receiver according to an embodiment when the skew is changed from −4.5 UI to 4.5 UI (e.g., the protocol of 1 T=9 UI). At a time t1, it is found that as the second circuit of the lane LANE1 starts its operation and the second circuit starts its operation, the CLK-DATA skew is converged. At a time t2, the training may be finished and the CDR operation on the input data may be performed. After 1 T, it is found that the second circuit performs the same operation and the locking range of the second circuit is infinite.

Figure 13:
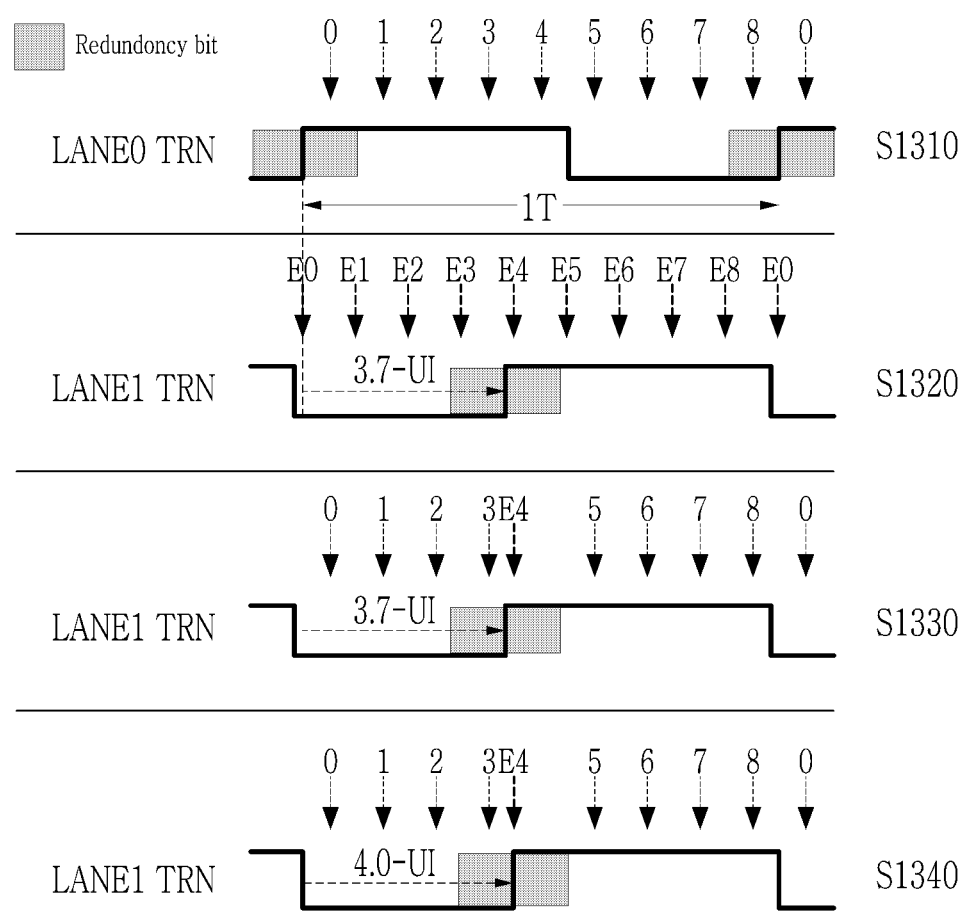
FIG. 13 shows a skew correcting method, according to another embodiment.
Figure 14:
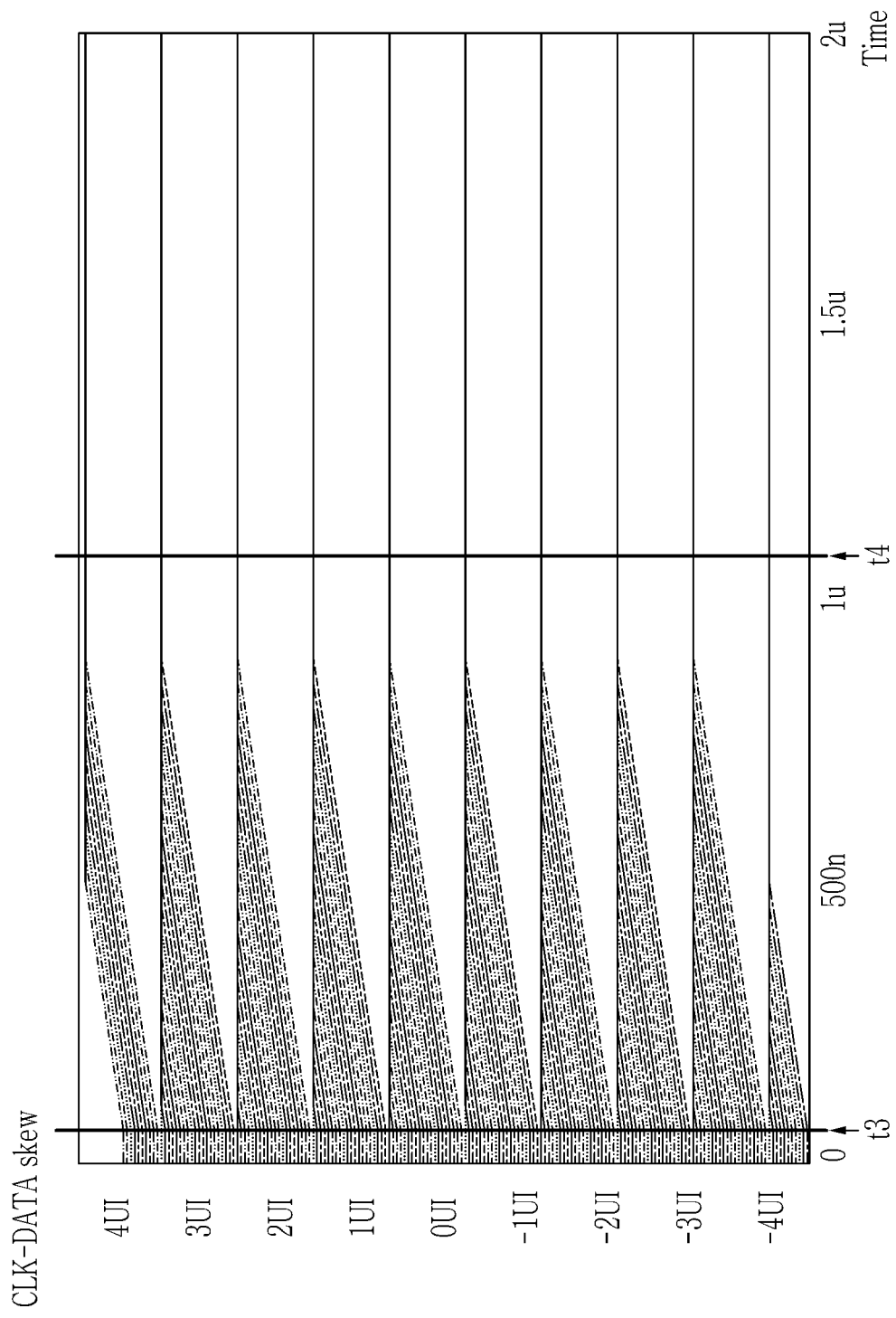
FIG. 14 shows a graph of simulation results obtained by performing a skew correcting method, according to another embodiment.

FIG. 13 shows a skew correcting method according to another embodiment, and FIG. 14 shows a graph of simulation results obtained by performing a skew correcting method according to another embodiment.

Referring to FIG. 13, the receiver according to an embodiment may use the protocol of 1 T=9 UI, and may use redundancy bits of 2 bits for clock embedding just before the time when the data start on the time axis.

The first circuit may perform a locking operation to the lane LANE0 by using the training pattern LANE0 TRN for the lane LANE0 and the data clock signal (S1310). Referring to FIG. 13, arrows marked with numbers of 0 to 8 and facing downward may indicate respective edges of nine data clock signals. The first circuit may transmit the data clock signal used in the locking operation of the lane LANE0 to the second circuit.

The second circuit may receive the training pattern LANE1 TRN for the lane LANE1 (S1320). The second circuit may receive nine edge clock signals E0 to E8 corresponding to the nine data clock signals used in the locking operation of the lane LANE0 from the first circuit. The skew by 3.7 UI may exist between the training pattern LANE0 TRN for the lane LANE0 and the training pattern LANE1 TRN for the lane LANE1. The second circuit may sample the training pattern LANE1 TRN for the lane LANE1 by using the nine edge clock signals E0 to E8.

That is, the value of '0' is output as the sampling result of the edge clock signal E3 of the number 3, and the value of '1' is output as the sampling result of the edge clock signal E4 of the number 4.

The second circuit may output the selection signal SEL for instructing the delay cell outputting the edge clock signal E4 of the number 4 from among a plurality of delay cells of the first circuit to output not the data clock signal but the edge clock signal E4 of the number 3 to the second circuit (S1330). That is, the delay cell outputting the edge clock signal E4 of the number 4 from among a plurality of delay cells may output the data clock signal corresponding to the edge clock signal E4 of the number 4 to the lane LANE0, and may output the edge clock signal E4 of the number 4 to the lane LANE1. The second circuit may include an edge selector for outputting the selection signal SEL. The remaining delay cells from among a plurality of delay cells may output the data clock signal. Hence, the locking operation of the lane LANE1 may be completed.

The second circuit may delay the timing of the training pattern LANE1 TRN for the lane LANE1 so that the edge generated time of the training pattern LANE1 TRN may be identical to the edge generated time of the edge clock signal E4 of the number 4 (S1340). That is, the second circuit may further include a phase detector for controlling the timing. Hence, the skew by 3.7 UI may be corrected to 4.0 UI between the training pattern LANE0 TRN for the lane LANE0 and the training pattern LANE1 TRN for the lane LANE1. The skew may be removed from the deserializer or the link to thus allow alignment of data. The second circuit may sample the data LANE1 DATA and may generate recovered data based on a timing-controlled training pattern.

Referring to FIG. 14, when there is a skew (e.g., CLK-DATA skew) between the edge clock signal output by the lane LANE0 and the input data for the lane LANE1, it may be found that how the skew value changes with respect to time (Time). The CLK-DATA skew between the edge clock signal output by the lane LANE0 and the input data for the lane LANE1 may be identical to the skew between the training pattern LANE0 TRN for the lane LANE0 and the training pattern LANE1 TRN for the lane LANE1.

FIG. 14 shows output results of the receiver according to an embodiment when the skew is changed from −4.5 UI to 4.5 UI (e.g., the protocol of 1 T=9 UI). At a time t3, it is found that, as the second circuit of the lane LANE1 starts its operation and the second circuit starts its operation, the CLK-DATA skew is converged to a phase that is adjacent in the up (UP) direction from an initial skew. At a time t4, the training may be finished and the CDR operation on the input data may be performed. After 1 T, it is found that the second circuit performs the same operation and the locking range of the second circuit is infinite.

Figure 15:
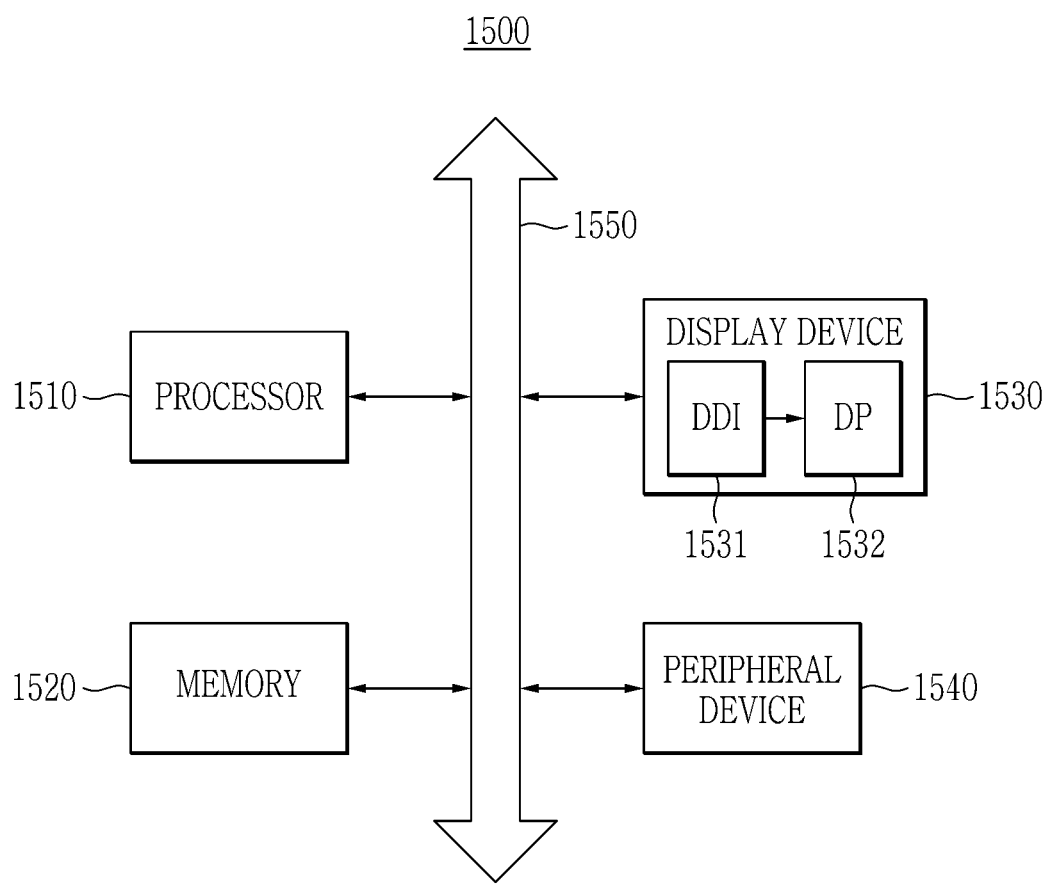
FIG. 15 shows a semiconductor system, according to an embodiment.

FIG. 15 shows a semiconductor system according to an embodiment.

Referring to FIG. 15, the semiconductor system 1500, according to an embodiment, may include a processor 1510, a memory 1520, a display device 1530, and a peripheral device 1540 electrically connected to the system bus 1550.

The processor 1510 may control inputs and outputs of data of the memory 1520, the display device 1530, and the peripheral device 1540, and may image-process the image data transmitted between the corresponding devices.

The display device 1530 includes a display driver IC (DDI) 1531 and a display panel (DP) 1532, and it may store the image data applied through the system bus 1550 in a frame memory included in the DDI 1531 and may display the same to the display panel 1532. The receiver according to the embodiments of the present invention may be integrated into the DDI 1531.

The peripheral device 1540 may be a device for converting videos or still images into electrical signals, such as cameras, scanners, or webcams. The image data obtained through the peripheral device 1540 may be stored in the memory 1520 or may be displayed in real time to the display panel 1532.

The memory 1520 may include a volatile memory such as a dynamic random access memory (DRAM) and/or a non-volatile memory such as a flash memory. The memory 1520 may be configured with a DRAM, a phase-change random access memory (PRAM), a magnetic random access memory (MRAM), a resistive random access memory (Re-RAM), a ferroelectric random access memory (FRAM), a NOR flash memory, a NAND flash memory, and a fusion flash memory (e.g., a memory that is a combination of a static random access memory (SRAM) buffer, a NAND flash memory, and a NOR interface logic). The memory 1520 may store the image data obtained from the peripheral device 1540 or the video signals processed by the processor 1510.

The semiconductor system 1500 may be installed in the mobile electronic product such as a smartphone, and without being limited thereto, it may be installed in various types of electronic products displaying images.

In an embodiment, the respective constituent elements described with reference to FIG. 1 to FIG. 15 or combinations of two or more constituent elements may be realized with digital circuits, programmable or non-programmable logic devices or arrays, or application specific integrated circuits (ASIC).

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A skew correcting device, comprising:
a plurality of samplers configured to sample first data based on a plurality of data clock signals with different phases; and
a plurality of edge selectors configured to:
determine to switch at least one data clock signal of the plurality of data clock signals to an edge clock signal according to a sampling result at the plurality of samplers; and
in response to an enable signal being at a third level, respectively output a selection signal, when a first level of a first output signal of a corresponding first sampler of the plurality of samplers differs from a second level of a second output signal of a second sampler of the plurality of samplers.

2. The skew correcting device of claim 1, further comprising a controller configured to synchronize start timings of the plurality of data clock signals and the first data.

3. The skew correcting device of claim 1, wherein:
the plurality of samplers are further configured to sequentially perform the sampling of the first data; and
the second sampler is configured to perform the sampling of the first data after the corresponding first sampler performs the sampling of the first data.

4. The skew correcting device of claim 3, wherein the plurality of edge selectors are further configured to:
in response to the enable signal being at the third level, respectively output the selection signal, when the first level of the first output signal of the corresponding first sampler corresponds to '0' and the second level of the second output signal of the second sampler corresponds to '1'.

5. The skew correcting device of claim 4, wherein each edge selector of the plurality of edge selectors comprises:
a logic circuit configured to output a logic output signal having a fourth level when the first level of the first output signal of the corresponding first sampler corresponds to '0' and the second level of the second output signal of the second sampler corresponds to '1'; and
a latch configured to:
store the logic output signal of the logic circuit, in response to the logic output signal having the fourth level and the enable signal being at the third level; and
output the selection signal based on the stored logic output signal.

6. The skew correcting device of claim 1, further comprising a delay-locked loop (DLL) circuit configured to output, from a reference clock signal, a data clock signal and the edge clock signal.

7. The skew correcting device of claim 6, wherein:
the DLL circuit is disposed on a second circuit configured to receive second data and to perform clock and data recovery (CDR); and
the plurality of samplers and the plurality of edge selectors are disposed on a first circuit configured to perform CDR on the first data by using the data clock signal and the edge clock signal that are output by the DLL circuit.

8. The skew correcting device of claim 6, wherein the DLL circuit is further configured to output the edge clock signal according to a determination of the plurality of edge selectors.

9. The skew correcting device of claim 6, wherein the DLL circuit comprises:
a buffer configured to delay an input clock signal resulting in a delayed clock signal; and
a switch configured to output the input clock signal or the delayed clock signal, according to determination of the plurality of edge selectors.

10. The skew correcting device of claim 9, wherein:
the input clock signal is the edge clock signal; and
the delayed clock signal is the data clock signal.

11. The skew correcting device of claim 9, wherein the switch comprises at least one of a transmission gate and a tri-state inverter.

12. A skew correcting device, comprising:
a first circuit configured to receive first data and to perform clock and data recovery (CDR); and
a second circuit configured to perform CDR on second data by using a data clock signal and an edge clock signal that are output by the first circuit,
wherein the second circuit comprises an edge selector configured to:
select the edge clock signal that is near a rising edge of a redundancy bit of the second data; and
output a selection signal based on a first level of a first output signal from a first sampler being different from a second level of a second output signal of a second sampler, and
wherein the first circuit comprises a delay-locked loop (DLL) circuit configured to output the edge clock signal to the second circuit, according to a selection of the edge selector.

13. The skew correcting device of claim 12, wherein the edge selector is further configured to:
receive the first output signal from the first sampler and the second output signal from the second sampler, the first sampler being located in close proximity to the second sampler.

14. A method for correcting a skew of a second lane from a first lane of a multilane device, comprising:
providing, from the first lane to the second lane, a plurality of data clock signals for sampling a center of first data input to the first lane;
sampling, in the second lane, a training pattern based on the plurality of data clock signals;
determining, based on a sampling result in the second lane, that an edge is generated between a first data clock signal of the plurality of data clock signals and a second data clock signal of the plurality of data clock signals;
providing, from the first lane to the second lane, an edge clock signal disposed between the first data clock signal and the second data clock signal for sampling an edge of the first data;
switching at least one of the first data clock signal and the second data clock signal to the edge clock signal;
shifting second data input to the second lane based on the edge clock signal; and
sampling the second data by using remaining data clock signals of the plurality of data clock signals excluding the first data clock signal or the second data clock signal, and the edge clock signal.

15. The method of claim 14, wherein the training pattern comprises at least one redundancy bit.

16. The method of claim 15, further comprising sampling the at least one redundancy bit using the first data clock signal and the second data clock signal.

17. The method of claim 14, wherein the edge generated between the first data clock signal and the second data clock signal is a rising edge.

18. The method of claim 14, wherein:
the switching of at least one of the first data clock signal and the second data clock signal to the edge clock signal comprises switching the first data clock signal to the edge clock signal; and
the sampling of the second data comprises sampling the second data by using the remaining data clock signals excluding the first data clock signal and the edge clock signal.

19. The method of claim 14, wherein:
the switching of at least one of the first data clock signal and the second data clock signal to the edge clock signal comprises switching the second data clock signal to the edge clock signal; and the sampling of the second data comprises sampling the second data by using the remaining data clock signals excluding the second data clock signal and the edge clock signal.

20. The method of claim 14, wherein the determining that the edge is generated between the first data clock signal and the second data clock signal comprises:
repeating the sampling of the training pattern for a quantity of k times; and
determining two data clock signals having generated a greatest number of edges to be the first data clock signal and the second data clock signal, k being an integer that is greater than 1.

* * * * *